United States Patent [19]

Shuffield, Jr.

[11] 4,176,286
[45] Nov. 27, 1979

[54] SIGNAL TRANSLATOR WITH SQUELCH

[75] Inventor: Thomas E. Shuffield, Jr., N. Little Rock, Ark.

[73] Assignee: BEI Electronics, Inc., Little Rock, Ark.

[21] Appl. No.: 884,599

[22] Filed: Mar. 8, 1978

[51] Int. Cl.² ........................................... H03K 5/153
[52] U.S. Cl. ..................... 307/237; 307/261; 307/358; 307/362; 325/348; 325/478
[58] Field of Search ............... 307/237, 261, 362, 358; 328/99; 330/51; 325/348, 478

[56] References Cited

U.S. PATENT DOCUMENTS

| | | | |
|---|---|---|---|
| 2,681,989 | 6/1954 | Cunniff | 328/99 X |
| 3,332,021 | 7/1967 | Hedlund | 325/478 X |
| 3,336,533 | 8/1967 | Glasser | 330/51 |

Primary Examiner—John Zazworsky
Attorney, Agent, or Firm—Burmeister, York, Palmatier, Hamby & Jones

[57] ABSTRACT

Input tone signals are supplied to a square wave generator for producing square wave output signals corresponding to the tone signals. The square wave generator includes an operational amplifier having a tone signal input and a control signal input for receiving a first control voltage for activating the amplifier and a second control voltage for squelching the amplifier. The control voltages are produced by squelch control voltage generating means for receiving the input tone signals and producing the first control voltage when the tone signals exceed a predetermined level, while producing the second control voltage when the input tone signals are less than such predetermined level. The squelch control voltage generating means may include rectifying means for producing a rectified direct current signal in response to the tone signals, integrating means for producing an integrated direct current signal in response to the rectified direct current signal, and comparator means for receiving the integrated direct current signal and producing the first control voltage when the integrated direct current signal exceeds an established level, while producing the second control voltage when the integrated direct current signal is less than the established level. These squelch control voltage generating means may also include regulating means for regulating and limiting the magnitude of the integrated signal in excess of the established level. Such regulating means may employ a Schottky diode connected to the integrating means.

12 Claims, 2 Drawing Figures

SIGNAL TRANSLATOR WITH SQUELCH

This invention relates to a signal translator for producing output signals having a substantially uniform high magnitude, in response to input signals which may vary in magnitude over a wide range, while squelching any output when the input signals are below a predetermined level.

One object of the present invention is to provide a new and improved signal translator for producing square wave output signals of a substantially uniform, high magnitude in response to any alternating current input tone signals of variable wave form and widely variable magnitude.

A further object is to provide a signal translator of the foregoing character, having squelch means for preventing the production of any output signals when the magnitude of the input signals falls below a predetermined level.

It is a further object to provide such a new and improved signal translator which is especially well adapted for developing output signals which will produce dependable operation of a digital decoder, in response to tone signals of widely varying magnitude, derived from band splitting filters or the like.

Thus, it is an object of the present invention to provide a new and improved signal translator which is well adapted for processing the individual tone signals in a dual tone multiple frequency (DTMF) signaling system, such as the familiar telephone dialing system using tone signals.

A more specific object of the present invention is to provide a signal translator for producing square wave output signals of a high substantially uniform magnitude in response to input tone signals varying over a wide range, extending, for example, between −24 dBm and +10 dBm (600 ohms).

A further object is to provide such a signal translator which will squelch any output for input signals below the minimum desired level, such as −24 dBm, for example.

Another object is to provide such a new and improved signal translator in which the squelch circuit will operate satisfactorily with short tone bursts, having durations as short as 40 milliseconds (ms), for example.

A further object is to provide a signal translator of the foregoing character which is arranged so that it is easy to change the various operating parameters, such as the squelch threshold and the output signal level.

To achieve these objects, the present invention may provide a signal translator, comprising a square wave generator including an operational amplifier having a tone signal input for receiving tone signals and a square wave output for delivering square wave output signals corresponding to the tone signals, the operational amplifier having a switching input for receiving a first control voltage for activating the amplifier and a second control voltage for squelching the amplifier, and squelch control voltage generating means for receiving the tone signals and producing the first control voltage when the tone signals exceed a predetermined level while producing the second control voltage when the tone signals are less than such predetermined level.

The squelch control voltage generating means may include rectifying means for producing a rectified direct current signal in response to the tone signals, integrating means for producing an integrated direct current signal in response to the rectified direct current signal, and comparator means for receiving the integrated direct current signal and producing the first control voltage when the integrated direct current signal exceeds an established level while producing the second control voltage when the integrated direct current signal is less than the established level.

The squelch control voltage generating means may include regulating means for regulating and restricting the mangitude of the integrated direct current signal in excess of the established level. The regulating means may include a Schottky diode connected to the integrating means.

Further objects, advantages and features of the present invention will appear from the following description, taken with the accompanying drawings, in which.

Figure 1:
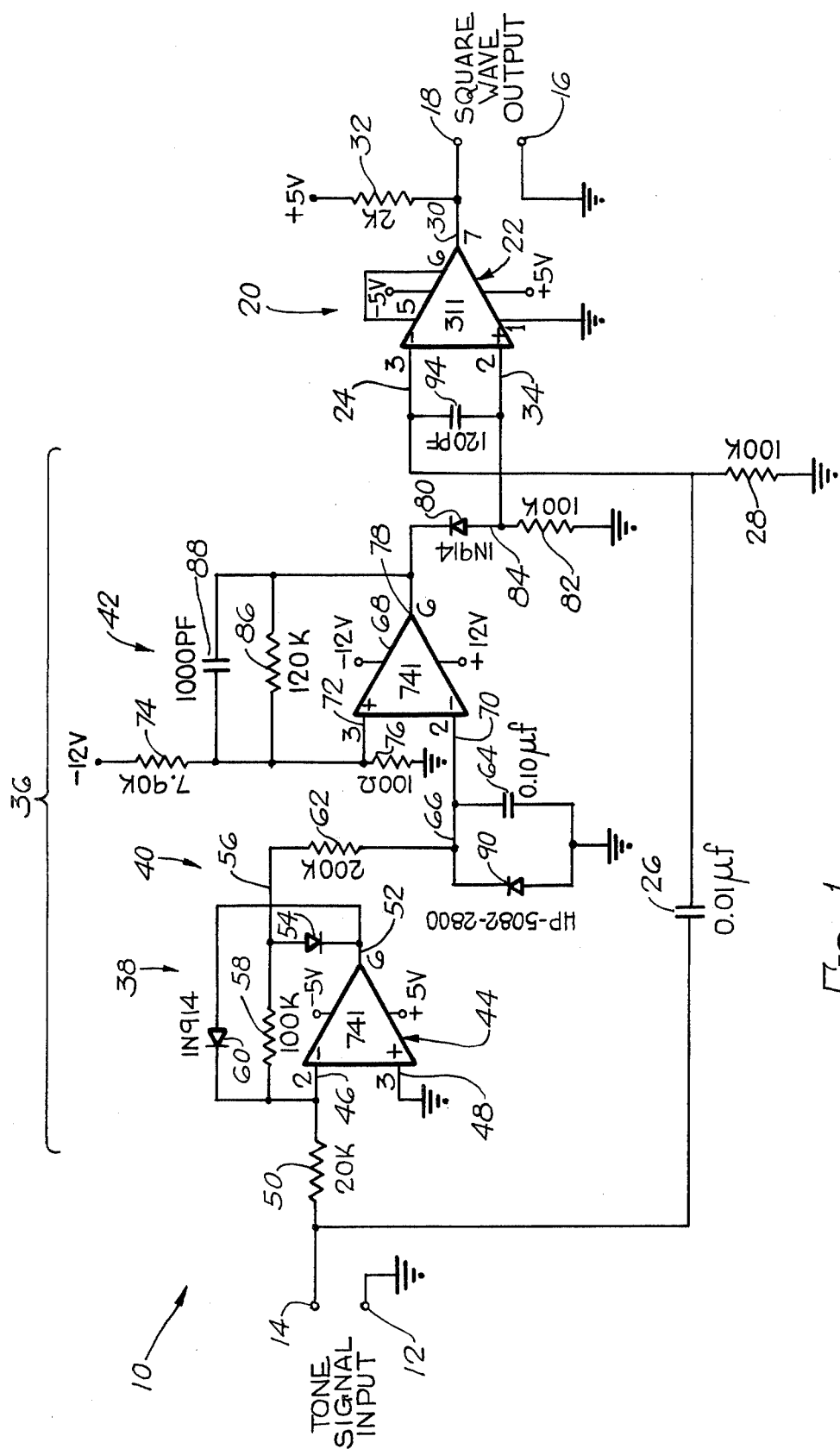
FIG. 1 is a schematic circuit diagram of a signal translator to be described as an illustrative embodiment of the present invention.

As indicated above, FIG. 1 illustrates a signal translator 10 for producing square wave output signals in response to alternating current tone signals. Thus, the signal translator 10 is illustrated as comprising grounded and ungrounded input terminals 12 and 14, adapted to receive alternating current tone signals, which may be derived, for example, from the output of a band splitting filter. The tone signals may vary in wave form, and also may range widely in magnitude. For example, the input tone signals may be approximately sinusoidal in waveform. The signal translator 10 may be adapted to respond to input tone signals ranging in magnitude from −24 dBm to −10 dBm, for example.

The illlustrated translator 10 has grounded and ungrounded output terminals 16 and 18 for delivering square wave output signals of a high, substantially uniform magnitude, regardless of variations in the magnitude of the input signals. For example, the square wave output signals may switch between 0 and +5 volts. The square wave output signals may be employed to produce reliable operation of a digital decoder, such as the Collins Radio decoder, Model CRC-8030, intended for use as a digital decoder in a dual tone multiple frequency (DTMF) signalling system, of the type frequently used for telephone dialing.

The illustrated signal translator 10 comprises square wave generating means 20, which may utilize an integrated circuit 22, serving as a comparator or operational amplifier. The integrated circuit 22 may be of the commercially available type 311, especially adapted for operation as a comparator.

As illustrated, the integrated circuit 22 has an inverting input 24 which serves as the signal input terminal of the square wave generator 20 and is adapted to receive the input tone signals. To supply the tone signals, a coupling capacitor 26 is connected between the ungrounded input terminal 14 and the signal input terminal 24. The coupling capacitor 26 transmits the alternating current tone signals, while blocking any direct current signals which may appear across the input terminals 12 and 14. A return resistor 28 is connected between the signal input terminal 24 and ground, so that there will be no direct current biasing voltage on the signal input terminal 24.

The ungrounded output terminal 18 is connected to an uncommitted collector output terminal 30 of the integrated circuit 22. A load resistor 32 is connected between the output terminal 18 and a power supply terminal, which in this case provides +5 volts. Thus, the output square waves on the output terminal 18 switch between 0 and +5 volts. Pins 5 and 6 of the integrated circuit 22 are connected together to produce balanced operation of the integrated circuit 22, so that the output square wave will have a clean 50/50 duty cycle.

The illustrated integrated circuit 22 has a non-inverting input terminal 34 which serves as a switching signal input for the square wave generating means 20. When the switching input 34 is at a first control voltage, which is zero or ground potential in this instance, the integrated circuit 22 functions in the manner of a zero crossing detector to produce a square wave output in response to an alternating current signal input at the terminal 24. When the switching input 34 is supplied with a second control voltage, which may be approximately −12 volts in this instance, the operation of the integrated circuit 22 is squelched or prevented, so that no output signal is produced. This squelching action is brought about when the input signals at the tone signal input terminal 12 and 14 drop below a predetermined level, such as −24 dBm, for example. Thus, input signals below the predetermined level will produce no output at all. Input signals above the squelch threshold level will produce square wave output signals of substantially uniform magnitude, regardless of the magnitude of the input signals, within a wide range.

The first and second control voltages for the squelching operation are produced by squelch voltage generating means 36, connected between the tone signal input terminal 14 and the control signal terminal 34. The squelch signal generating means 36 may comprise rectifying means 38 for producing a rectified direct current signal in response to the input tone signals, integrating means 40 for integrating the direct current signal and thereby producing an integrated signal, and comparator means 42 for producing either the first control signal or the second control signal, depending upon whether the integrated direct current signal is above or below an established level.

As shown in FIG. 1, the rectifying means 38 may employ an integrated circuit taking the form of an operational amplifier 44 having inverting and non-inverting inputs 46 and 48. In this case, the non-inverting input 48 is grounded, while the inverting input 46 is connected through an input resistor 50 to the ungrounded tone signal input terminal 14. The operational amplifier 44 has an output terminal 52, from which a rectified direct current output signal is supplied through a diode rectifier 54 to an output line or conductor 56. An inverse feedback resistor 58 is connected between the output line 56 and the inverting input 46. A clamping diode 60 is connected between the output terminal 52 and the input 46 and is polarized to provide maximum inverse feedback for any positively polarized voltage excursions on the output terminal 52. The diode 60 prevents the operational amplifier 44 from running "open-loop" when the diode 54 is not conducting. The diode 60 improves the response time of the rectifying means 38 by preventing the operational amplifier 44 from saturating, which also prevents its output from latching to the positive power supply rail.

The rectifier circuit 38 functions as a half-wave rectifier. The resistors 50 and 58 set the gain of the circuit. The gain factor is approximately equal to the ratio of the resistance values of the resistors 58 and 50. For example, as indicated in FIG. 1, these resistance values may be 100 k and 20 k ohms to afford a gain of approximately 5.

In the circuit of FIG. 1, the integrating means 40 may comprise a resistor 62 and a capacitor 64 connected in series between the output line 56 and ground. An output junction lead 66 is connected between the resistor 62 and the capacitor 64. The resistor 62 and the capacitor 64 may also be regarded as comprising a low pass filter which transmits and integrates the negative half-wave direct current pulses from the rectifier circuit 38, while attenuating or reducing the ripple or alternating current components. With the values given by way of example in FIG. 1, the resistor 62 and the capacitor 64 afford a time constant of 20 milliseconds.

The gain of the rectifying circuit 38 may be set to produce a desired level of the direct current signal across the capacitor 64, when the input tone signal across the input terminals 12 and 14 rises to a predetermined level. For example, the gain of the rectifying circuit 38 may be adjusted so that an alternating current input of −24 dBm (600 ohms) across the input terminals 12 and 14 will produce a direct current signal level of 150 millivolts across the capacitor 64. Due to the provision of the integrating circuit 40, this D.C. voltage may have an upper to lower ripple of less than 10 millivolts.

The D.C. signal across the capacitor 64 is supplied to the comparator means 42. As shown by way of example in FIG. 1, the comparator means 42 may employ an integrated circuit in the form of an operational amplifier 68, which may be of the commercially available type 741. As shown, the amplifier 68 has an inverting input 70 which is connected to the output junction lead 66, so that the voltage across the capacitor 64 appears between the input 70 and ground. The amplifier 68 also has a non-inverting input 72 which is preferably given a direct current bias voltage by voltage dividing resistors 74 and 76 which in this case are connected in series between a −12 volt power supply terminal and ground. The non-inverting input 72 is connected to the junction between the resistors 74 and 76. The values of the resistors 74 and 76 are selected or adjusted to establish a desired bias voltage level at the non-inverting input 72. For example, this established level may be adjusted to −150 millivolts. The values of 7.90 k and 100 ohms indicated by way of example for the resistors 74 and 76 in FIG. 1, will establish this biasing voltage, with a power supply of −12 volts. With this arrangement, the direct current signal voltage at the inverting input 70 is compared with the biasing voltage at the non-inverting input 72.

In the comparator circuit 42 of FIG. 1, the amplifier 68 has an output terminal 78 from which a diode 80 and a resistor 82 are connected in series to ground. A junction lead 84 between the diode 80 and the resistor 82 is connected to the switching input 34 of the square wave generating circuit 20. In this case, the diode 80 is polarized to transmit negative signals only.

In the comparator circuit 42, a small amount of positive feedback is provided by a high value resistor 86 and a low value capacitor 88, connected in parallel between the output terminal 78 and the non-inverting input terminal 72 of the operational amplifier 68.

Figure 2:
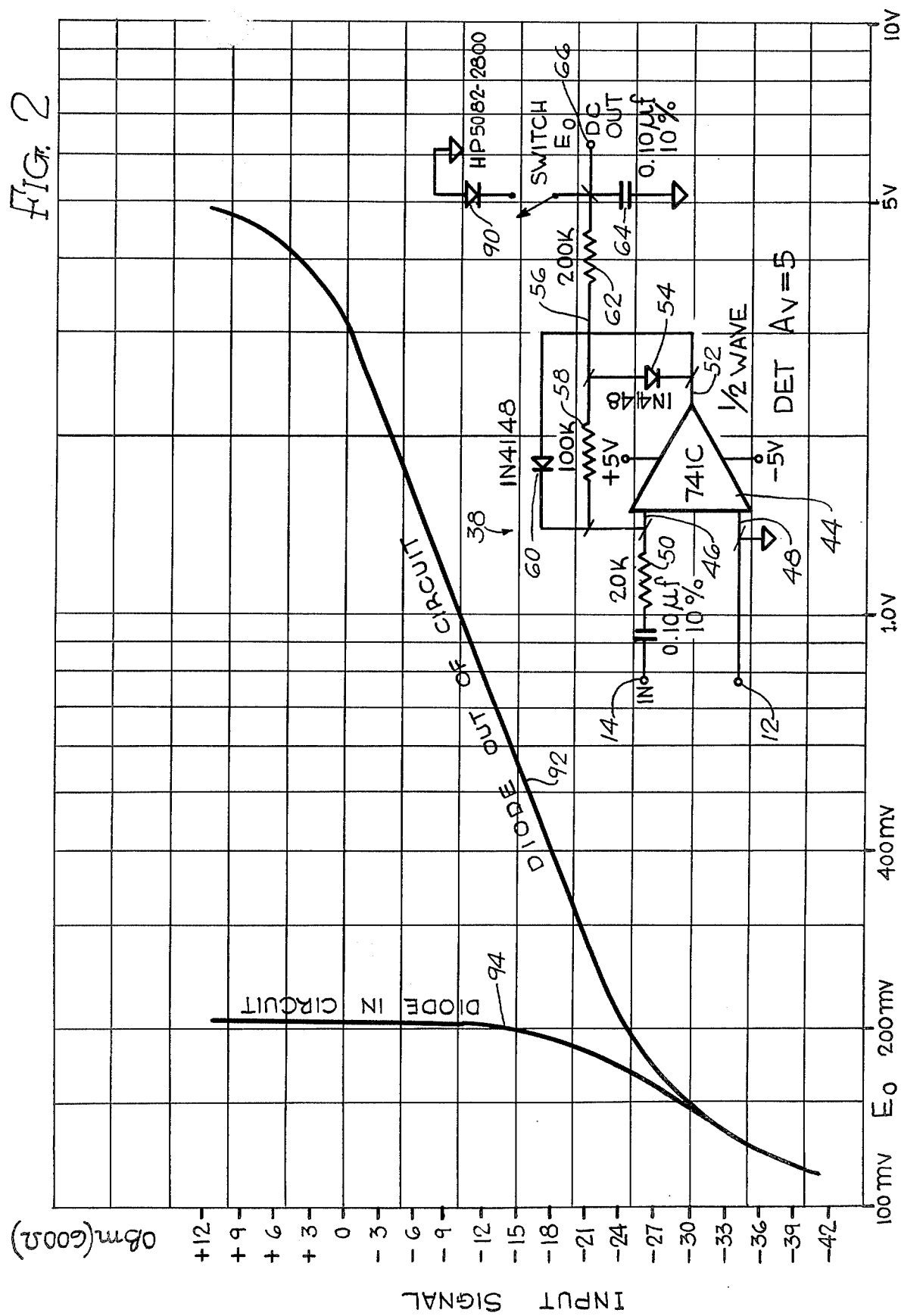
FIG. 2 is a set of graphs, illustrating the operation of a portion of the signal translator of FIG. 1.

It is preferred to provide regulating means for regulating or restricting the magnitude of the integrated direct current signal at the input 70 of the operational amplifier 68. For example, such regulating means may take the form of a super Schottky diode 90, connected in parallel with the integrating capacitor 64. The purpose of the diode 90 is to clamp or regulate the direct current level at the input 70 to a maximum of approximately −220 millivolts. This regulating or clamping action is illustrated in the graphs of FIG. 2, showing the relationship between the tone signal input level and the DC output level $E_o$ for two different conditions. Thus, FIG. 2 includes a first graph 92 showing this relationship when the regulating diode 90 is switched out of the circuit, and a second graph 94 showing such relationship when the diode 90 is in the circuit. With the regulating diode 90 out of the circuit, as represented by the graph 92, the DC voltage across the capacitor 64 rises steadily and in an approximately linear manner from about 200 millivolts to about 5 volts, when the alternating current input signal is varied in amplitude from about −24 dBm to about +12 dBm. When the regulating diode 90 is in the circuit, the direct current output voltage rises much less rapidly and is restricted to a value of less than 220 millivolts, rather than 5 volts, for a high input level of +12 dBm.

This regulating action of the Schottky diode 90 reduces the release time of the squelch comparator circuit 42, so that the releasing action is speeded up. The release time depends upon the time required for the capacitor 64 to discharge from its maximum voltage to the comparison level of about 150 millivolts. By restricting the maximum voltage across the capacitor 64 to about 220 millivolts, rather than 5 volts, the regulating diode 90 greatly reduces the time required for the capacitor to discharge down to 150 millivolts.

As previously indicated, the squelch threshold level is established by the adjustment of the negative DC input voltage on the non-inverting input 72 of the squelch comparator amplifier 68. For low input signal levels across the input terminals 12 and 14, below about −24 dBm, the integrated direct current signal at the inverting input 70 will be less than the bias level of −150 millivolts. For this condition, the comparator amplifier 68 develops an output voltage corresponding approximately to the negative power supply rail voltage, which is −12 volts in this case. This high negative voltage is trasmitted by the diode 80 to the switching input 34 of the square wave generator 20 and is effective to squelch or inactivate the square wave generator 20.

When the input signal level across the input terminals 12 and 14 rises above the squelch threshold, the direct current signal at the non-inverting input 72 will become greater in magnitude than the bias voltage of −150 millivolts. When this happens, the output voltage from the comparator amplifier 68 will slew to approximately the positive power supply rail voltage, which is +12 volts in this instance. The diode 80 is polarized so that this positive output voltage is not transmitted to the switching input 34 of the square wave generator 20. Accordingly, the switching input 34 will be at ground potential, so that the square wave generator will be activated. Accordingly, the square wave generator 20 will translate the alternating current input signals from the input terminals 12 and 14 to square wave output signals having a substantially uniform output level of +5 volts across the output terminals 16 and 18.

As previously indicated, the resistor 76 works with the voltage dividing resistor 74 to provide the desired biasing voltage of about −150 millivolts at the non-inverting input 72 of the comparator amplifier 68. In addition, the resistor 76 works with the feedback resistor 86 and the feedback capacitor 88 to apply the proper amount of feed forward signal to the input 72 to achieve a desirable hysteresis action. The basic hysteresis action, due to the resistor 86, is improved by the capacitor 88, which provides an additional feedforward signal at the instant of the switching of the comparator amplifier 68. The value of the capacitor 88 may be varied, but it has been found that the value given by way of example in FIG. 1 results in a clean, fast switching action for the comparator amplifier 68.

As previously indicated, the squelch comparator amplifier 68 produces a large negative output voltage, such as −12 volts, when the magnitude of the DC signal at the input 70 is less than the bias level of −150 millivolts. This negative output voltage is transmitted by the diode 80 to the non-inverting input 34 of the translating amplifier 24, so as to drive the output of the amplifier 22 to zero or ground potential. When the negative DC signal on the input 70 exceeds the bias level of 150 millivolts, the squelch comparator amplifier 68 produces an output of approximately +12 volts, which backbiases the diode 80 and is not transmitted to the input 34. Accordingly, the voltage at the non-inverting input 34 is 0, so that the translating amplifier 22 operates as a zero cross detector to produce square waves corresponding to the alternating current signals at the input 24. The ground return resistors 28 and 82, connected to the inputs 24 and 34, should preferably be of equal value to maintain a 50/50 duty cycle in the square wave output from the amplifier 22. Any DC differential voltage between the inputs 24 and 34 should be avoided when the amplifier 22 is performing its translating function, in order to maintain the 50/50 duty cycle.

In the illustrated translating circuit 20, a small value capacitor 94 is preferably connected between the inputs 24 and 34 to allow proper balancing of the differential inputs at high frequencies, and to provide some rejections of stray high frequency signals that fall outside the interest of the dual tone multiple frequency receiver system.

To recapitulate, the square wave generator 20 translates the alternating current input signals across the input terminals 12 and 14 into square wave output signals across the output terminals 16 and 18, for input signals having a magnitude greater than the squelch threshold level. For input signals below the squelch threshold, the squelch voltage generator 36 produces a high negative voltage which is applied to the switching input 34, so as to squelch or inactivate the translating amplifier 24. Accordingly, no output appears across the output terminals 16 and 18.

When the square wave generator 20 is carrying on its normal translating function, for alternating current input signals above the squelch threshold level, the translating amplifier 22 produces square wave output signals having a substantially uniform amplitude, regardless of variations of the amplitude of the input signals. The square wave amplitude is approximately 5 volts in this instance. The uniform high amplitude of the square output signals will produce reliable operation of a digital decoder, or any other suitable utilization device, connected to the output terminals 16 and 18.

It will be understood that the values and type designations of the various components may be varied to achieve various results. Those skilled in the art will be able to assign suitable values and type designations to the various components. However, for the sake of completeness, illustrative values and type designations are given by way of example in FIG. 1. These values and type designations have been found to afford satisfactory operation.

Various modifications, alternative constructions and equivalents may be employed without departing from the true spirit and scope of the present invention as disclosed in the foregoing description and defined in the following claims.

I claim:
1. A signal translator, comprising
a square wave generator including an operational amplifier having a tone signal input for receiving tone signals and a square wave output for delivering square wave output signals corresponding to said tone signals,
said operational amplifier having a switching input for receiving a first control voltage for activating said amplifier and a second control voltage for squelching said amplifier,
and squelch control voltage generating means for receiving said tone signals and producing said first control voltage when said tone signals exceed a predetermined level while producing said second control voltage when said tone signals are less than said predetermined level,
said squelch control voltage generating means including control signal producing means for converting said tone signals into a corresponding control signal,
and comparator means for receiving said control signal and producing said first control voltage when said control signal exceeds an established level while producing said second control voltage when said control signal is less than said established level,
whereby said amplifier is activated when said control signal exceeds the established level but is squelched when said control signal is less than the established level.

2. A signal translator, comprising
a square wave translating device having an alternating current signal input for receiving alternating current signals and a square wave output for delivering square wave output signals corresponding to said alternating current signals,
said translating device having a switching input for receiving a first control voltage for activating said translating device and a second control voltage for squelching said translating device,
and squelch control voltage generating means for receiving said alternating current signals and producing said first control voltage when said alternating current signals exceed a predetermined threshold level while producing said second control voltage when said alternating current signals are less than said threshold level,
said squelch control voltage generating means including control signal producing means for converting said alternating current signals into a corresponding control signal,
and comparator means for receiving said control signal and producing said first control voltage when said control signal exceeds an established level while producing said second control voltage when said control signal is less than said established level,
whereby said translating device is activated when said control signal exceeds the established level but is squelched when said control signal is less than the established level.

3. A signal translator, comprising
a square wave generator including an operational amplifier having a tone signal input for receiving tone signals and a square wave output for delivering square wave output signals corresponding to said tone signals,
said operational amplifier having a switching input for receiving a first control voltage for activating said amplifier and a second control voltage for squelching said amplifier,
and squelch control voltage generating means for receiving said tone signals and producing said first control voltage when said tone signals exceed a predetermined level while producing said second control voltage when said tone signals are less than said predetermined level,
said squelch control voltage generating means including rectifying means for producing a rectified direct current signal in response to said tone signals,
integrating means for producing an integrated direct current signal in response to said rectified direct current signal,
and comparator means for receiving said integrated direct current signal and producing said first control voltage when said integrated direct current signal exceeds an established level while producing said second control voltage when said integrated direct current signal is less than said established level.

4. A signal translator according to claim 3,
in which said squelch control voltage generating means includes regulating means for regulating and limiting the magnitude of said integrated direct current signal in excess of said established level.

5. A signal translator according to claim 4,
in which said regulating means includes a Schottky diode connected to said integrating means.

6. A signal translator, comprising
a square wave translating device having an alternating current signal input for receiving alternating current signals and a square wave output for delivering square wave output signals corresponding to said alternating current signals,
said translating device having a switching input for receiving a first control voltage for activating said translating device and a second control voltage for squelching said translating device,
squelch control voltage generating means for receiving said alternating current signals and producing said first control voltage when said alternating current signals exceed a predetermined threshold level while producing said second control voltage when said alternating current signals are less than said threshold level,
said squelch control voltage generating means including rectifying means for producing a rectified direct current signal in response to said alternating current signals,
integrating means for producing an integrated direct current signal in response to said rectified direct current signal,
and comparator means for receiving said integrated direct current signal and producing said first control voltage when said integrated direct current signals exceed an established level while producing said second control voltage when said integrated direct current signal is less than said established level.

7. A signal translator according to claim 6, in which said squelch control voltage generating means includes regulating means for regulating and limiting the magnitude of said integrated direct current signal in excess of said established level.

8. A signal translator according to claim 7, in which said regulating means includes a Schottky diode connected to said integrating means.

9. A signal translator according to claim 6, in which said integrating means includes an integrating resistance in series with an integrating capacitor adapted to be charged and discharged through said resistance,
and regulating means for regulating and limiting the maximum magnitude of the integrated direct current signal across said capacitor, to reduce the time required for said capacitor to discharge through said resistance.

10. A signal translator according to claim 9, in which said regulating means includes a Schottky diode connected across said capacitor.

11. A signal translator according to claim 6, in which said comparator means includes an operational amplifier having an inverting input for receiving said integrated direct current signals,
said operational amplifier having a non-inverting input,
means for producing a bias voltage at said established level on said non-inverting input,
said operational amplifier having an output,
means connecting said last mentioned output to said switching input of said translating device,
and a feedback resistance connected between said last mentioned output and said non-inverting input to provide a hysteresis action.

12. A signal translator according to claim 11, including a feedback capacitor connected in parallel with said feedback resistance.

* * * * *

UNITED STATES PATENT AND TRADEMARK OFFICE
CERTIFICATE OF CORRECTION

PATENT NO. : 4,176,286
DATED : November 27, 1979
INVENTOR(S) : Thomas E. Shuffield, Jr.

It is certified that error appears in the above-identified patent and that said Letters Patent are hereby corrected as shown below:

Column 2, line 34, "- 10 dBm" should be -- + 10 dBm --

Column 3, line 23, "terminal" should be -- terminals --

Column 6, line 24, "cross" should be -- crossing --

Signed and Sealed this

Eighteenth Day of March 1980

[SEAL]

Attest:

SIDNEY A. DIAMOND

Attesting Officer

Commissioner of Patents and Trademarks